(12) United States Patent
Kodama et al.

(10) Patent No.: US 8,385,994 B2
(45) Date of Patent: Feb. 26, 2013

(54) SUPERCONDUCTING JOINT AND METHOD FOR MANUFACTURING SAME

(75) Inventors: Motomune Kodama, Hitachi (JP); Tsuyoshi Wakuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 32 days.

(21) Appl. No.: 13/188,594

(22) Filed: Jul. 22, 2011

(65) Prior Publication Data

US 2012/0021915 A1    Jan. 26, 2012

(30) Foreign Application Priority Data

Jul. 23, 2010   (JP) ................................. 2010-165703

(51) Int. Cl.
*H01L 39/14* (2006.01)

(52) U.S. Cl. ...................................................... 505/231

(58) Field of Classification Search .......... 505/220–232, 505/329, 190
See application file for complete search history.

(56) References Cited

U.S. PATENT DOCUMENTS

| 5,134,040 A * | 7/1992 | Benz et al. ..................... 428/646 |
| 5,521,150 A * | 5/1996 | Murakami et al. ............ 505/450 |
| 5,786,304 A * | 7/1998 | Kimura et al. ................ 505/234 |
| 6,921,865 B2 | 7/2005 | Morita et al. |
| 7,152,302 B2 | 12/2006 | Morita et al. |
| 2011/0028327 A1 | 2/2011 | Kodama et al. |

FOREIGN PATENT DOCUMENTS

| JP | 4-319280 | 11/1992 |
| JP | 2003-022719 | 1/2003 |
| JP | 2011-029557 | 2/2011 |

* cited by examiner

*Primary Examiner* — Colleen Dunn
(74) *Attorney, Agent, or Firm* — Antonelli, Terry, Stout & Kraus, LLP.

(57) ABSTRACT

There is provided a superconducting joint for electrically connecting a first multifilamentary superconducting wire including a plurality of first superconducting filaments embedded in a first stabilizer matrix and a second multifilamentary superconducting wire including a plurality of second superconducting filaments embedded in a second stabilizer matrix. The joint includes: a first bundle of bare superconducting filaments being formed by removing the first stabilizer matrix at an end joint portion of the first superconducting wire; a second bundle of bare superconducting filaments being formed by removing the second stabilizer matrix at an end joint portion of the second superconducting wire; and an intermediate superconductor interposed in contact relationships between the first and the second bundles, a critical current density of the intermediate superconductor under an operating condition of the superconducting joint being less than a critical current density of the bare superconducting filaments under the operating condition.

14 Claims, 4 Drawing Sheets

INVENTED JOINT              CONVENTIONAL JOINT

FIG. 6

FIG. 7

SUPERCONDUCTING JOINT AND METHOD FOR MANUFACTURING SAME

CLAIM OF PRIORITY

The present application claims priority from Japanese patent application serial no. 2010-165703 filed on Jul. 23, 2010, the content of which is hereby incorporated by reference into this application.

BACKGROUND OF THE INVENTION

1. Field of the Invention

The present invention relates to superconducting joints for electrically connecting superconducting wires and, in particular, to a superconducting joint having high quench tolerance and method for manufacturing the same.

2. Description of Related Art

Techniques for electrically connecting superconducting wires are important for practical use of superconducting wires. One of the simplest methods is to solder sufficiently long joint (overlapping) portions of a pair of superconducting wires to each other (hereinafter "soldering method"). Typically, superconducting wires are formed by embedding plural superconducting filaments in a stabilizer (such as copper and aluminum). Therefore, in superconducting joints formed by soldering methods, an operating current flows from one bundle of superconducting filaments to the other bundle of superconducting filaments via a stabilizer, a solder and the other stabilizer. Thus, the joint resistances of superconducting joints formed by soldering methods are relatively large due to the electrical resistances of the solder and stabilizers. For example, even a joint having a joint (overlapping) length of as long as several meters has a joint resistance of as high as $10^{-9}\Omega$.

Typical apparatuses including a superconducting magnet wound from a superconducting wire are nuclear magnetic resonance (NMR) apparatuses and magnetic resonance imaging (MRI) apparatuses, which are widely used in the biotechnology or medical field. In general, these apparatuses are operated in a persistent current mode, and require a magnetic field decay rate of as extremely low as 0.1 ppm/h or less. Joints used in such apparatuses need to have a low joint resistance of at least less than $10^{-12}\Omega$. In order to achieve such a low joint resistance, superconducting joints without any intervening non-superconducting resistive conductors are necessary.

Crimp-type joints have been proposed as such a resistive conductor-free superconducting joint. Methods for fabricating a crimp-type joint include: removing the stabilizer and exposing the superconducting filaments at an end joint portion of each of superconducting wires to be connected; inserting, in a metal pipe, the two bundles of the exposed superconducting filaments; and crimping the two bundles together by compressing and crushing the metal pipe. See, for example, JP-A Hei 4 (1992)-319280. In crimp-type joints, a pair of bundles of bare superconducting filaments are in direct contact with each other without any intervening non-superconducting resistive conductors (such as a stabilizer and a solder). As a result, joint resistances of less than $10^{-13}\Omega$ can be achieved. Because of this advantage, crimp-type joints are currently widely used for superconducting magnets in NMR or MRI apparatuses requiring very low resistance joints.

JP-A 2003-022719 discloses a crimp-type superconducting joint in which a powdered superconductor containing magnesium diboride ($MgB_2$) is interposed between a pair of bundles of bare superconducting filaments. The JP-A 2003-022719 describes that the invented crimp-type superconducting joint has a low joint resistance even under a relatively high magnetic field.

Superconducting wires and magnets have a problem called quenching. Quenching is a phenomenon by which the superconductivity of a superconductor suddenly disappears even when the operating current of the superconductor is less than the rated current. Quenching degrades the operational stability and reliability of superconducting apparatuses, and is therefore one of the most serious problems to be solved.

Conventional crimp-type superconducting joints such as the one disclosed in the JP-A Hei 4 (1992)-319280 are more vulnerable to quenching than other superconducting components. This is partly because in a crimp-type superconducting joint, the stabilizer at an end joint portion of each superconducting wire is removed. Stabilizers have a function to suppress temperature rise due to thermal disturbance since they have a high heat capacity, and also have a function to dissipate generated heat. Therefore, crimp-type superconducting joints have poor quench tolerance because of the absence of stabilizer. Also, the quench tolerance of the superconducting joint disclosed in the JP-A 2003-022719 is not sufficiently improved.

SUMMARY OF THE INVENTION

In view of the foregoing, it is an objective of the present invention to provide a superconducting joint for connecting superconducting wires having a low joint resistance and high quench tolerance, and a method for manufacturing the same.

(I) According to a first aspect of the present invention, there is provided a superconducting joint for electrically connecting a first multifilamentary superconducting wire including a plurality of first superconducting filaments embedded in a first stabilizer matrix and a second multifilamentary superconducting wire including a plurality of second superconducting filaments embedded in a second stabilizer matrix, the superconducting joint including:

a first bundle of first bare superconducting filaments, the first bare superconducting filaments being formed by removing the first stabilizer matrix and exposing the first filaments at an end joint portion of the first superconducting wire;

a second bundle of second bare superconducting filaments, the second bare superconducting filaments being formed by removing the second stabilizer matrix and exposing the second filaments at an end joint portion of the second superconducting wire; and an intermediate superconductor interposed in contact relationships between the first and the second bundles, a critical current density of the intermediate superconductor under an operating condition of the superconducting joint being less than critical current densities of the first and the second bare superconducting filaments under the operating condition.

Here, two superconducting wires may be connected, or the opposite ends of one superconducting wire may be connected.

In the above aspect (I) of the present invention, the following modifications and changes can be made.

i) The intermediate superconductor is a plate in form; one broad surface of the intermediate superconductor plate is electrically connected with the first bundle; and the other broad surface of the intermediate superconductor plate is electrically connected with the second bundle.

ii) The intermediate superconductor plate satisfies a relationship of "$\mu_0(J_{c\text{-}int} d_{int})^2 < 3C_{int}(T_{c\text{-}int} - T_o)$", where: $\mu_0$ is the magnetic permeability of vacuum; $d_{int}$ is a thickness of the intermediate superconductor plate; $T_o$ is a temperature of the operating condition; $T_{c\text{-}int}$ is a critical temperature of the intermediate superconductor plate under the operating condition; $J_{c\text{-}int}$ is a critical current density of the intermediate superconductor plate under the operating condition; and $C_{int}$ is a heat capacity per unit volume of the intermediate superconductor plate under the operating condition.

iii) The first and the second bundles satisfy a relationship of "$\mu_0 (J_{c\text{-}fil} d_{fil})^2 < 3 C_{fil} (T_{c\text{-}fil} - T_o)$", where: $\mu_0$ is the magnetic permeability of vacuum; $d_{fil}$ is the greater of thicknesses of the first and the second bundles; $T_o$ is a temperature of the operating condition; $T_{c\text{-}fil}$ is a critical temperature of the first and the second bare superconducting filaments under the operating condition; $J_{c\text{-}fil}$ is a critical current density of the first and the second bare superconducting filaments under the operating condition; and $C_{fil}$ is a heat capacity per unit volume of the first and the second bare superconducting filaments under the operating condition.

iv) A critical current density of the first bare superconducting filaments under the operating condition is less than an average critical current density of the first superconducting filaments embedded in the first stabilizer matrix under the operating condition; and a critical current density of the second bare superconducting filaments under the operating condition is less than an average critical current density of the second superconducting filaments embedded in the second stabilizer matrix under the operating condition.

v) The first and the second bundles and the intermediate superconductor are contained in a joint cover for crimping together the first and the second bundles and the intermediate superconductor.

vi) The joint cover is a metal pipe; and the first and the second bundles, the intermediate superconductor and the metal pipe are compressed together by an external compressing force so that the first and the second bundles and the intermediate superconductor are crimped together in the metal pipe.

vii) A thermal expansion coefficient of the metal pipe in a temperature range from room temperature to the operating temperature is greater than a thermal expansion coefficient of the first and the second bare superconducting filaments in the temperature range.

viii) The joint cover is a pair of metal plates having metal bolts therethrough; the first and the second bundles and the intermediate superconductor are sandwiched between the metal plates; and the metal plates are tightened against each other by the metal bolts so that the first and the second bundles and the intermediate superconductor are crimped together between the metal plates.

ix) A thermal expansion coefficient of the metal bolts in a temperature range from room temperature to the operating temperature is greater than a thermal expansion coefficient of the first and the second bare superconducting filaments in the temperature range.

x) The intermediate superconductor is made of niobium or an alloy primarily of niobium and titanium.

xi) There is provided a nuclear magnetic resonance or magnetic resonance imaging apparatus including the superconducting joint according to the present invention.

(II) According to a second aspect of the present invention, there is provided a method for manufacturing a superconducting joint for electrically connecting a first multifilamentary superconducting wire including a plurality of first niobium-titanium filaments embedded in a first stabilizer matrix and a second multifilamentary superconducting wire including a plurality of second niobium-titanium filaments embedded in a second stabilizer matrix, the method including the steps of:

removing the first stabilizer matrix and exposing the first niobium-titanium filaments at a first end joint portion of the first superconducting wire;

removing the second stabilizer matrix and exposing the second niobium-titanium filaments at a second end joint portion of the second superconducting wire;

inserting, in a metal pipe, a first bundle of the exposed first niobium-titanium filaments, a second bundle of the exposed second niobium-titanium filaments, and a niobium-titanium intermediate plate in such a manner that the intermediate plate is interposed between the first and the second bundles, the intermediate plate having a critical current density under an operating condition of the superconducting joint less than the exposed first and the exposed second niobium-titanium filaments; and crimping the intermediate plate and the first and the second bundles together by compressing the metal pipe by a compressing force normal to the broad surfaces of the intermediate plate.

In the above aspect (II) of the present invention, the following modification or change can be made.

xii) The method according to the invention further includes, prior to the filament exposing step, the step of adjusting the critical current densities of the first and the second niobium-titanium filaments in the first and the second end joint portions of the first and the second superconducting wires by heating the first and the second end joint portions at a temperature from 400 to 600° C.

Advantages of the Invention

According to the present invention, it is possible to provide a superconducting joint for connecting superconducting wires having a low joint resistance and high quench tolerance. Also, it is possible to provide a method of manufacturing the same.

DETAILED DESCRIPTION OF THE PREFERRED EMBODIMENTS

Preferred embodiments of the present invention will be described below with reference to the accompanying drawings. The invention is not limited to the specific embodiments described below, but various combinations and modifications are possible without departing from the spirit and scope of the invention.

Figure 1:
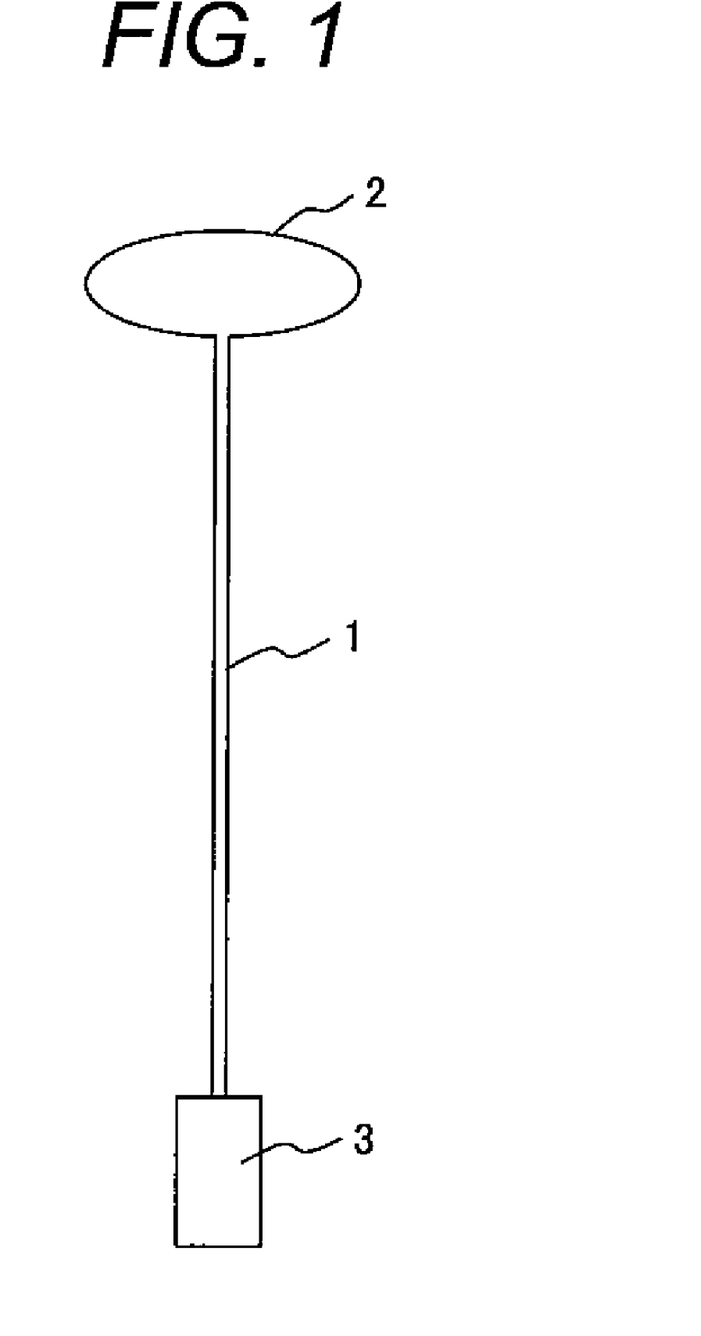
FIG. 1 is a schematic illustration showing a test device for measuring electrical conduction characteristics of superconducting joints.

FIG. 1 is a schematic illustration showing a test device for measuring electrical conduction characteristics of superconducting joints. As illustrated, the test device is formed by bending a 1-m long multifilamentary superconducting wire 1, and has a loop 2 at one end and a superconducting joint 3 at the other end. The superconducting wire 1 used is a commercially available niobium-titanium (Nb—Ti) multifilamentary superconducting wire formed by embedding several hundreds of Nb—Ti filaments in an oxygen-free copper stabilizer matrix.

(Test of Conventional Joint)

Figure 2:
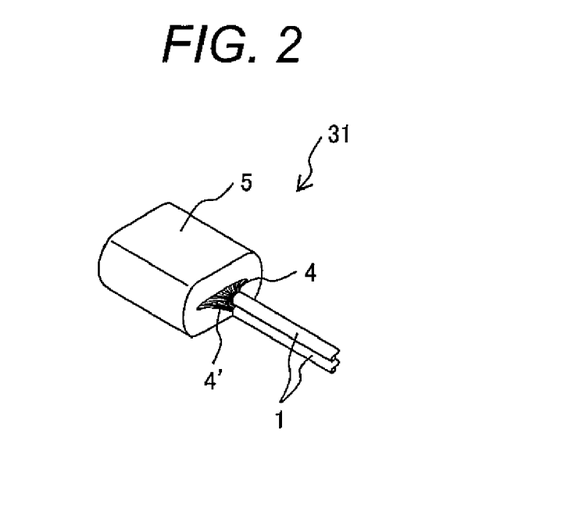
FIG. 2 is a schematic illustration showing a perspective view of an example of a conventional crimp-type superconducting joint.

The inventors examined in detail the electrical conduction characteristics of a conventional crimp-type superconducting joint, found a problem with the conventional crimp-type joint and discussed possible causes of the problem. FIG. 2 is a schematic illustration showing a perspective view of an example of a conventional crimp-type superconducting joint. The conventional crimp-type superconducting joint 31 in FIG. 2 is formed as follows: First, each opposite end portion (35 mm long) of the superconducting wire 1 is dipped in nitric acid to dissolve the stabilizer matrix of the end portion, thereby exposing the superconducting filaments. Next, a first bundle of the exposed (bare) filaments 4 at one end portion of the wire 1 and a second bundle of the exposed (bare) filaments 4' at the other end portion are inserted in an oxygen-free copper pipe 5 (outer diameter of 15 mm, inner diameter of 4 mm and length of 25 mm). Finally, the first and the second bundles are crimped in the pipe 5 by compressing and crushing the pipe 5 by uniaxial pressing.

Figure 3:
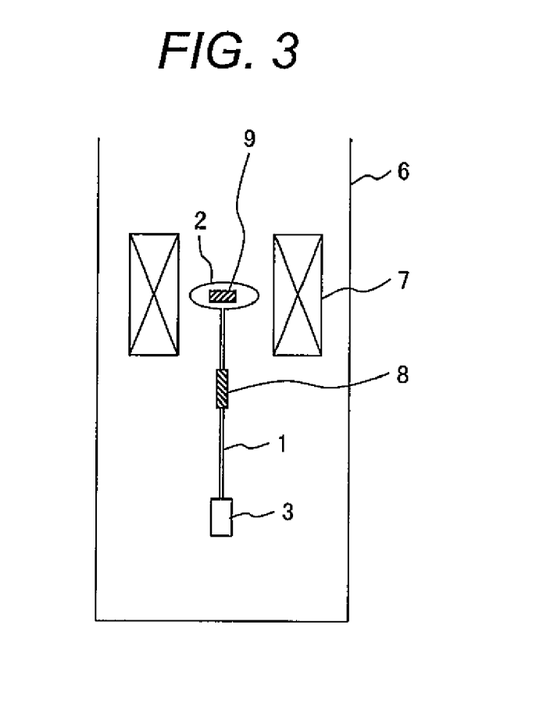
FIG. 3 is a schematic illustration showing a test system for measuring electrical conduction characteristics of superconducting joints.

The electrical conduction characteristics of the joint 3 in FIG. 2 are measured as follows: FIG. 3 is a schematic illustration showing a test system for measuring the electrical conduction characteristics of superconducting joints. As illustrated, the test system in FIG. 3 includes: an induction coil 7, a heater 8, a Hall sensor 9, and a cryostat 6 filled with liquid helium for containing and cooling these elements 7, 8 and 9. The test device shown in FIG. 1 is inserted in this test system in such a manner that the loop 2 of the test device is positioned within the induction coil 7.

A current is supplied to the test device as follows: First, a portion of the test device (a portion of the straight portion of the multifilamentary superconducting wire 1) is heated by the heater 8 to destroy the superconductivity of the portion. Next, a current is supplied to the induction coil 7 to generate a magnetic flux, part of which passes through the loop 2 of the test device. Then, the heater 8 is turned off to revive the superconductivity of the above-mentioned portion of the test device. And then, the current supply to the coil 7 is stopped. As a result, a current is induced in the test device to conserve the magnetic flux through the loop 2. After that, the trapped magnetic flux density at the center of the loop 2 is measured with the Hall sensor 9 over time.

Figure 4:
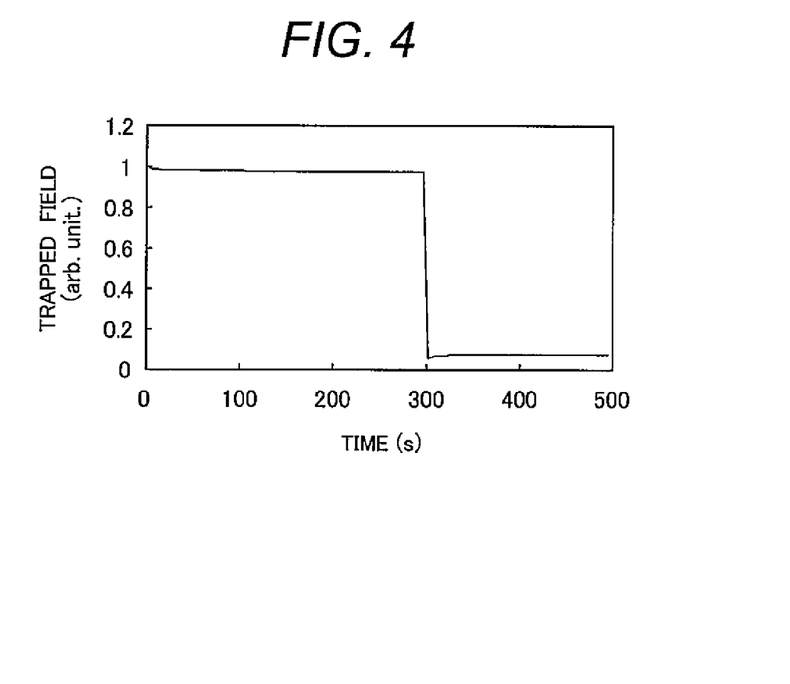
FIG. 4 is a chart showing an example of the electrical conduction characteristics (change in trapped magnetic flux density with time) for the conventional superconducting joint.

FIG. 4 is a chart showing an example of the electrical conduction characteristics (change in the trapped magnetic flux density with time) for the conventional superconducting joint 31. As shown in FIG. 4, after about 300 seconds, the trapped magnetic flux density at the loop center suddenly and discontinuously decreases. This is probably because a quench occurs in the conventional superconducting joint 31 and, as a result, the magnetic energy stored in the loop 2 of the test device is dissipated as Joule heat. This experimental result shows that the conventional crimp-type superconducting joint 31 suffers from sudden quenching during superconducting operation.

(Discussion on Quenching in Conventional Joint)

There are the following two possible causes of the above-described quenching in the conventional crimp-type superconducting joint 31.

(Cause A) In conventional crimp-type superconducting joints, a large number of first superconducting filaments and a large number of second superconducting filaments, each of which has a high critical density, are collectively connected in an intermingled manner by crimping. As a result, the filament-filament contact conditions are not uniform throughout the joint. Therefore, the currents passable through the filament-filament contacts are also significantly imbalanced throughout the joint.

(Cause B) As described, first bare superconducting filaments and second bare superconducting filaments are collectively crimped and integrated into a single filament bundle. As a result, from the point of view of flux jumping, the integrated filament bundle becomes to behave like a single filament having a larger effective diameter (thickness) equal to the thickness of the integrated filament bundle. This will increase the possibility of flux jumping.

Next, these two causes A and B are described below in more detail.

(Cause A: Current Imbalance)

Typically, superconducting wires are designed so that the rated current density has a margin to the critical current density under the rated magnetic field. And, superconducting equipment such as superconducting coils is designed so that the operating current density and magnetic field do not exceed the rated current density and rated magnetic field of the superconducting wire used. On the other hand, superconducting joints are typically mounted in low magnetic field areas in a superconducting apparatus in view of space constraint or operational stability. The superconducting filaments in a superconducting joint under such a lower magnetic field can carry a higher current since superconducting materials generally have a higher critical current density under a lower magnetic field. Thus, the operating current of a superconducting joint can be carried by only a small part of the filaments in the joint.

As described, the conventional superconducting joint 31 is formed by collectively compressing and connecting the superconducting filaments 4 and the superconducting filaments 4' in the oxygen-free copper pipe 5. However, it is very difficult with such a method to make the filament 4/filament 4' contact conditions sufficiently equal throughout the joint 31. Hence, the current passable through the filament-filament contacts are significantly imbalanced or nonuniform throughout the joint 31. As a result, the operating current of the joint 31 gradually becomes localized and carried by only such filaments as having a better filament-filament contact condition.

To summarize, in a conventional superconducting joint, the operating current becomes localized and carried by only a small part of the superconducting filaments in the joint because each superconducting filament in the joint can have an excessively high critical current density (therefore, can carry an extremely large current) and the filament-filament contact conditions are not uniform throughout the joint. As a result, when some initial thermal disturbance occurs in the conventional joint and the superconductivity is lost, such superconducting filaments as carrying a very high current will generate a very large amount of Joule heat, incurring a higher possibility of quenching.

(Cause B: Flux Jumping)

Flux jumping is a vicious cycle described below, by which a quench is caused in a superconductor.

b-1) Some initial thermal disturbance increases the temperature of a superconductor.

b-2) The temperature rise decreases the critical current density of the superconductor. This in turn reconstructs the current distribution in the superconductor, and therefore moves or changes the magnetic flux in the superconductor.

b-3) This flux movement or change generates an electric field, whose energy is in turn dissipated as heat, thereby increasing the temperature of the superconductor.

In this cycle, when the superconductor temperature after the heat generation at the step b-3 is higher than that after the initial thermal disturbance at the step b-1, the superconductor temperature continues to rise even if the initial thermal disturbance disappears. As a result, a quench occurs.

It is known that the necessary condition for preventing flux jumping in a superconductor is given by the following equation:

$$\mu_0(J_c d)^2 < 3C(T_c - T_o) \quad \text{Eq. (1)}$$

where:

$\mu_0$ is the magnetic permeability of vacuum;

$J_c$ is a critical current density of the superconductor;

d is a thickness of a current conduction region of the superconductor;

C is a heat capacity per unit volume of the superconductor;

$T_c$ is a critical temperature of the superconductor; and $T_o$ is an operating temperature of the superconductor.

Equation 1 shows that the flux jumping possibility in the superconductor strongly depends on the term $(J_c\ d)^2$ (i.e., on the square of the product of the critical current density of the superconductor and the thickness of the current conduction region of the superconductor). Most commercial superconducting wires employ very thin superconducting filaments to decrease the thickness d of the filaments and suppress the occurrence of flux jumping. However, in the conventional crimp-type superconducting joint 31, the superconducting filaments 4 and 4' are collectively crimped and integrated into a single filament bundle in the oxygen-free copper pipe 5. This single filament bundle behaves like a single current conduction region having an increased effective thickness d equal to the thickness of the integrated filament bundle. As a result, the possibility of flux jumping increases.

(Structure of Invented Superconducting Joint)

Figure 5:
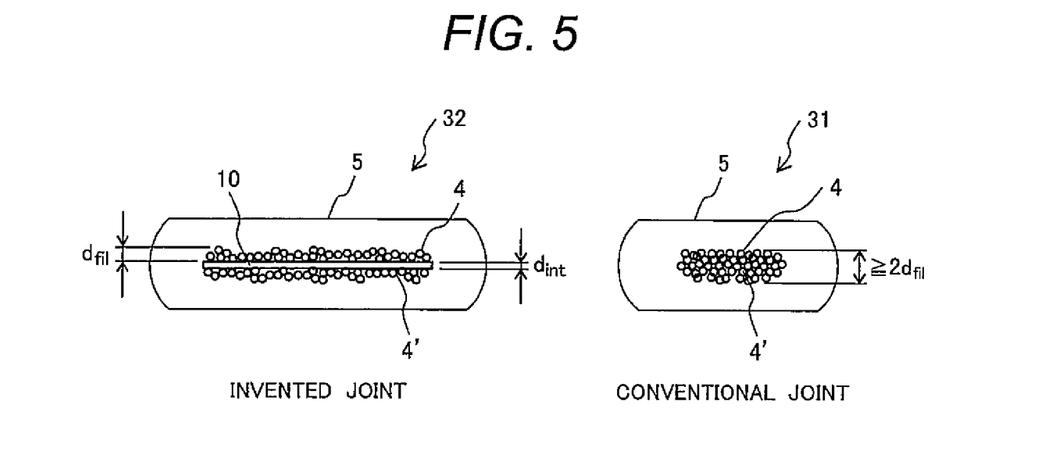
FIG. 5 is a schematic illustration showing cross sectional views of an example of an invented crimp-type superconducting joint and an example of a conventional crimp-type superconducting joint.

The invention is developed based on the above discussion. FIG. 5 is a schematic illustration showing cross sectional views of an example of an invented crimp-type superconducting joint and an example of a conventional crimp-type superconducting joint. As shown in FIG. 5, the invented superconducting joint 32 includes: a first bundle of bare superconducting filaments 4 (without a stabilizer matrix) at an end portion of a first multifilamentary superconducting wire; a second bundle of bare superconducting filaments 4' at an end portion of a second multifilamentary superconducting wire; a plate-like intermediate superconductor 10 interposed in contact relationships between the first and the second bundles; and a compressive joint cover 5 (such as an oxygen-free copper pipe) containing the first and the second bundles, and the intermediate superconductor 10. Here, the first and the second bundles, the intermediate superconductor 10, and the joint cover 5 are compressed together by an external compressing force. And, a critical current density of the intermediate superconductor plate 10 is less than that of the superconducting filaments 4 and 4'.

Because the intermediate superconductor plate 10 has a critical current density less than the filaments 4 and 4', the current flowing through each of the filaments 4 and 4' is limited to a certain level. Therefore, the operating current of the joint 32 can be prevented from becoming localized and carried by only a small part of the superconducting filaments 4 and 4'. That is, the currents passing through the filaments 4 and 4' can be relatively balanced or equalized. Hence, quenching due to a significant current imbalance (described in Cause A) can be prevented. In addition, in order to prevent quenching in the intermediate superconductor plate 10 due to flux jumping (described in Cause B), it is preferable to design the intermediate superconductor plate 10 so that the product of $J_{c-int}$ (critical current density of the intermediate superconductor plate 10) and $d_{int}$ (thickness of the intermediate superconductor plate 10) satisfies Eq. (1).

Also, in order to prevent quenching due to flux jumping (described in Cause B) in the filament 4 bundle and the filament 4' bundle, it is preferable to design the filament 4 bundle and filament 4' bundle so that the product of $J_{c-fil}$ (critical current density of the superconducting filaments 4 and 4') and $d_{fil}$ (the greater of thicknesses of the filament 4 bundle and the filament 4' bundle) satisfies Eq. (1). In the invented superconducting joint 32, the filament 4 bundle and the filament 4' bundle are compressed against the intermediate superconductor plate 10 and flattened on both broad surfaces of the plate 10. Thus, the thicknesses of the filament 4 bundle and the filament 4' bundle (and therefore, $d_{fil}$) can be reduced compared to the conventional superconducting joint 31 (see FIG. 5).

It is also preferable that the critical current density $J_{c-fil}$ of the bare superconducting filaments 4 and 4' under the operating condition of the joint 32 is lower than an average critical current density of the stabilizer-covered superconducting filaments in the first and the second superconducting wires under the same operating condition. This further decreases "$J_{c-fil}\ d_{fil}$", thereby further reducing the possibility of flux jumping.

EXAMPLES

The present invention will be described below in detail by way of specific examples. However, the invention is not limited to the specific examples below.

Niobium titanium (Nb—Ti) was used as a material for the intermediate superconductor 10. Niobium titanium has good plastic formability and therefore is easy to form into plate shapes. In addition, the properties of α-Ti precipitates and grain boundaries (both serving as pinning centers) in niobium titanium can be relatively readily controlled by heat treatment. Therefore, it is relatively easy to control the critical current density of niobium titanium-made superconductors.

First, a 10-mm diameter niobium titanium (Nb—Ti) round rod was rolled into a plate with a thickness $d_{int}$ of 0.5 mm. Then, the rolled plate was cut into a required length and width to form the intermediate superconductor plate 10. Next, the Nb—Ti intermediate superconductor plate 10 was heat treated under a vacuum of $10^{-3}$ Pa at 800° C. for 1 hour. The measured critical current density $J_{c-int}$ of the Nb—Ti intermediate plate 10 was 50 A/mm² at 4.2 K and 1 T. Thus, "$J_{c-int}\ d_{int}$" of the Nb—Ti intermediate superconductor plate 10 satisfies Eq. (1). Therefore, the Nb—Ti intermediate superconductor plate 10 is stable against flux jumping. Meanwhile, a temperature of 4.2 K (in liquid helium) and a magnetic field of 1 T is a typical condition under which most superconducting joints are operated.

Figure 6:
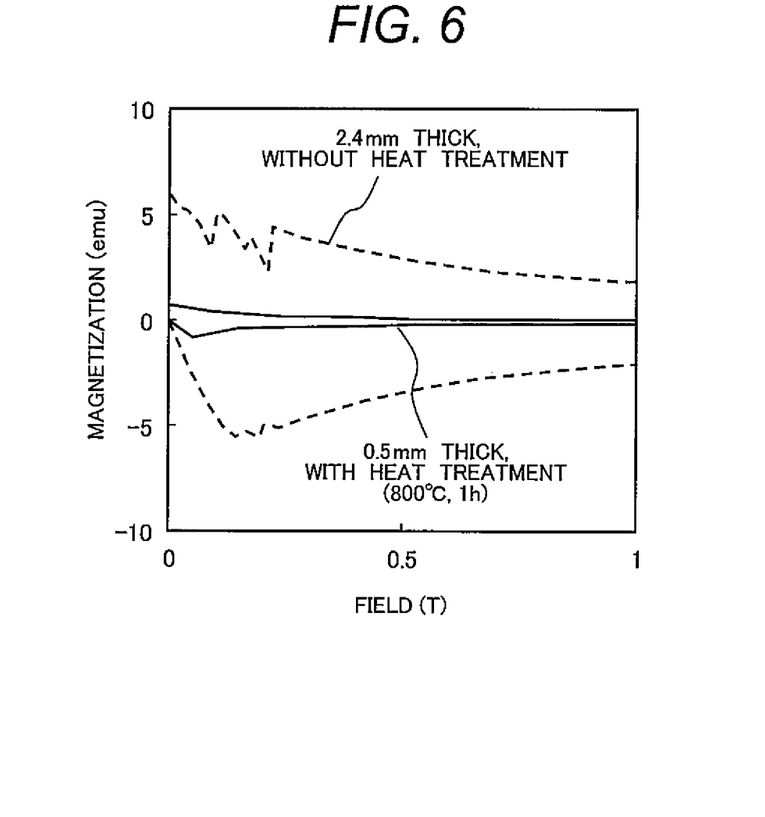
FIG. 6 is a graph showing magnetization curves at 4.2 K for a 2.4-mm thick rolled Nb—Ti plate without any heat treatment and for a 0.5-mm thick rolled Nb—Ti plate with a post-heat treatment.

FIG. 6 is a graph showing magnetization curves at 4.2 K for a 2.4-mm thick rolled Nb—Ti plate without any heat treatment and for a 0.5-mm thick rolled Nb—Ti plate with a post-heat treatment. As shown in FIG. 6, the 2.4-mm thick rolled Nb—Ti plate without any heat treatment undergoes sudden and abnormal magnetization fluctuations at some magnetic fields caused by flux jumping. By contrast, the heat-treated 0.5-mm thick rolled Nb—Ti plate undergoes no such flux jumping, and therefore has a higher quench tolerance.

The invented superconducting joint 32 was fabricated as follows: The superconducting wire 1 used was a commercially available 1-m long Nb—Ti multifilamentary superconducting wire formed by embedding several hundreds of Nb—Ti filaments in an oxygen-free copper stabilizer matrix. The critical current density of the Nb—Ti superconducting filament measured at the operating condition of the joint 32 (4.2 K and 1 T) was about $6 \times 10^3$ A/mm$^2$.

First, both end portions (each 100 mm long) of the superconducting wire 1 were heat treated in argon flow at 500° C. for 1 hour. The measured critical current density of the Nb—Ti superconducting filaments after the heat treatment was about $2 \times 10^3$ A/mm$^2$ at 4.2 K and 1 T. Next, both end portions (each 35 mm long) of the superconducting wire 1 were dipped in nitric acid to dissolve the stabilizer matrix and expose the superconducting filaments. Thus, there were prepared a first bundle of bare filaments 4 at an end portion of the superconducting wire 1 and a second bundle of bare filaments 4' at the other end portion. Then, the Nb—Ti intermediate superconductor plate 10 was sandwiched between the first and the second filament bundles, which were then inserted together in an oxygen-free copper pipe 5 (outer diameter of 15 mm, inner diameter of 8 mm and length of 25 mm). Finally, the first and the second filament bundles, and the intermediate plate 10 were crimped together in the pipe 5 by compressing the pipe 5 by uniaxial pressing.

Cross sections of the invented superconducting joint 32 and the conventional superconducting joint 31 were observed. The actual observed cross sections of these joints 32 and 31 were well represented by the schematic cross sections illustrated in FIG. 5. The observation showed that the thickness of each filament bundle in the invented superconducting joint 32 (about 100 μm) was thinner than that in the conventional superconducting joint 31 (about 300 μm). The critical current density of the filaments 4 and 4' in the invented superconducting joint 32 was about ⅓ of that in the conventional superconducting joint 31. As a result, $d_{fil}$ and $J_{c-fil}$ of the filament 4 bundle and the filament 4' bundle in the invented superconducting joint 32 satisfied Eq. (1). That is, the filament 4 bundle and the filament 4' bundle satisfied the necessary condition for being stable against flux jumping.

Figure 7:
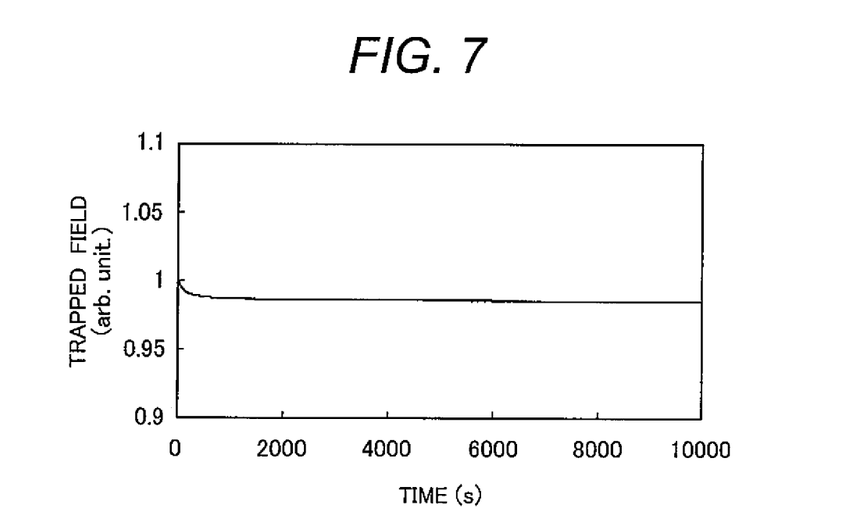
FIG. 7 is a chart showing an example of the electrical conduction characteristics (change in trapped magnetic flux density with time) for the invented superconducting joint.

The electrical conduction characteristics of the invented superconducting joint 32 were measured using the FIG. 1 test device, the FIG. 3 test system and the measurement procedure described before. FIG. 7 is a chart showing an example of the electrical conduction characteristics (change in the trapped magnetic flux density with time) for the invented superconducting joint 32. As shown in FIG. 7, the trapped magnetic flux density at the loop center did not show any discontinuous decreases until after 10,000 seconds. In addition, the measured joint resistance was as low as $10^{-13}$ Ω or less. These results show that the invented superconducting joint has a low joint resistance and high quench tolerance.

In the above example, a 0.5-mm thick Nb—Ti rolled plate that was post-heat treated at 800° C. for 1 hour was used as the intermediate superconductor plate 10. However, the material for the intermediate superconductor 10 is not limited to such a type. The current imbalances in the filament 4 bundle and the filament 4' bundle can be reduced by interposing, between the two filament bundles, any superconductor having a critical current density lower than that of the filaments 4 and 4'. For example, although typical superconducting Nb—Ti alloys have a Ti mass percentage of from 40 to 60%, a Nb—Ti alloy having a Ti mass percentage out of this range may be used so long as the Nb—Ti alloy has superconductivity under the operating conditions. Beside niobium titanium, other superconducting materials such as niobium (Nb), niobium tin (Nb$_3$Sn), magnesium diboride (MgB$_2$), and oxide superconductors may also be used.

Furthermore, the intermediate superconductor 10 is not limited to rolled plates in form, but may be a foil, a pipe, a powder metallurgical component, or the like. In addition, when the invented superconducting joint 32 experiences an external magnetic field, a shielding current is induced at a surface of the intermediate superconductor 10 in directions normal to the external magnetic field. In order to prevent flux jumping caused by such a shielding current, it is preferable that the intermediate superconductor 10 is sufficiently thin (or the product of the thickness and critical current density of the intermediate superconductor 10 is sufficiently small). It is also preferable that the intermediate superconductor 10 is so placed that its broad surfaces are parallel to the external magnetic field (i.e., its narrow surfaces are normal to the external magnetic field). When a pipe-like superconductor is used as the intermediate superconductor 10, the first and the second filament bundles are thinly extended along the outer and the inner walls of the intermediate superconductor pipe, respectively.

A material for the filaments of the multifilamentary superconducting wire 1 is not limited to niobium titanium, but may be other superconducting materials such as Nb$_3$Sn, MgB$_2$, and oxide superconductors. Also, a material for the stabilizer matrix is not limited to oxygen-free copper, but may be other commonly used stabilizers (or sheath materials) such as copper alloys, aluminum, aluminum alloys, iron, niobium, tantalum, and silver.

In the above example, the both end portions of the multifilamentary superconducting wire 1 were heat treated at 500° C. for 1 hour. The purpose is to adjust the critical current density of the filaments 4 and 4' to be inserted in the superconducting joint 32. Therefore, any other treatment may be used as long as the critical current density can be adjusted as desired. However, when niobium titanium filaments are heat treated, the heat treatment temperature is preferably from 400 to 600° C. This is because a heat treatment below 400° C. cannot provide desired adjustment of the critical current density. On the other hand, a heat treatment above 600° C. results in too small a critical current density so that a required operating current cannot be passed.

In the above example, the filaments 4 bundle, the filament 4' bundle, and the intermediate superconductor 10 are contained in a metal pipe (such as the oxygen-free copper pipe 5). And, the filaments 4 bundle, the filament 4' bundle, and the intermediate superconductor 10 are crimped together by compressing and crushing the metal pipe by uniaxial pressing. In order to successfully complete such a crimping process, the metal pipe is preferably made of a metal with a high Young's modulus and a low yield strength (or 0.2% proof strength). Also, the metal pipe preferably has a thicker wall for a larger heat capacity. In addition, a thermal expansion coefficient of the metal pipe in the temperature range from room temperature to the operating temperature of the superconducting joint 32 is preferably greater than that of the filaments 4 and 4'. This brings the two filament bundles into stronger contact with the intermediate superconductor 10 after a cooling to the operating temperature than before. In view of the above requirements, an annealed oxygen-free copper pipe with a thick wall is a preferable choice.

Instead of the oxygen-free copper pipe 5, a pair of metal plates having metal bolts therethrough may be used. Specifically, the first and the second filament bundles and the intermediate superconductor 10 are crimped together by sandwiching them between the metal plates and then tightening the metal plates against each other by the metal bolts. Similarly to the above metal pipe joint cover, the thermal expansion coefficient of the metal bolts in the temperature range from room temperature to the operating temperature of the superconducting joint 32 is preferably greater than that of the filaments 4 and 4'. This brings the two filament bundles into stronger contact with the intermediate superconductor 10 after a cooling to the operating temperature than before.

As has been described, the invented superconducting joint has a joint resistance of as low as $10^{-13}\Omega$ or less and high quench tolerance. Thus, the invented superconducting joint can be used for various superconducting apparatuses such as nuclear magnetic resonance apparatuses, magnetic resonance imaging apparatuses, large superconducting magnets, superconducting magnet energy storage apparatuses, magnetic separators, superconducting generators and magnets for nuclear fusion reactors. It should be added finally that by adjusting the joint (overlapping) length between a pair of superconducting wires (i.e., a pair of bare superconducting filament bundles) to be connected, any operating current equal to or less than the critical current of the superconducting wires can be passed through the invented superconducting joint.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A superconducting joint for electrically connecting a first multifilamentary superconducting wire including a plurality of first superconducting filaments embedded in a first stabilizer matrix and a second multifilamentary superconducting wire including a plurality of second superconducting filaments embedded in a second stabilizer matrix, the superconducting joint comprising:
    a first bundle of first bare superconducting filaments, the first bare superconducting filaments being formed by removing the first stabilizer matrix and exposing the first filaments at an end joint portion of the first superconducting wire;
    a second bundle of second bare superconducting filaments, the second bare superconducting filaments being formed by removing the second stabilizer matrix and exposing the second filaments at an end joint portion of the second superconducting wire; and
    an intermediate superconductor interposed in contact relationships between the first and the second bundles, a critical current density of the intermediate superconductor under an operating condition of the superconducting joint being less than critical current densities of the first and the second bare superconducting filaments under the operating condition.

2. The superconducting joint according to claim 1, wherein: the intermediate superconductor is a plate in form; one broad surface of the intermediate superconductor plate is electrically connected with the first bundle; and the other broad surface of the intermediate superconductor plate is electrically connected with the second bundle.

3. The superconducting joint according to claim 2, wherein the intermediate superconductor plate satisfies a relationship of "$\mu_0(J_{c\text{-}int} d_{int})^2 < 3C_{int}(T_{c\text{-}int} - T_o)$", where:
    $\mu_0$ is the magnetic permeability of vacuum;
    $d_{int}$ is a thickness of the intermediate superconductor plate;
    $T_o$ is a temperature of the operating condition;
    $T_{c\text{-}int}$ is a critical temperature of the intermediate superconductor plate under the operating condition;
    $J_{c\text{-}int}$ is a critical current density of the intermediate superconductor plate under the operating condition; and
    $C_{int}$ is a heat capacity per unit volume of the intermediate superconductor plate under the operating condition.

4. The superconducting joint according to claim 2, wherein the first and the second bundles satisfy a relationship of "$\mu_0 (J_{c\text{-}fil} d_{fil})^2 < 3C_{fil}(T_{c\text{-}fil} - T_o)$", where:
    $\mu_0$ is the magnetic permeability of vacuum;
    $d_{fil}$ is the greater of thicknesses of the first and the second bundles;
    $T_o$ is a temperature of the operating condition;
    $T_{c\text{-}fil}$ is a critical temperature of the first and the second bare superconducting filaments under the operating condition;
    $J_{c\text{-}fil}$ is a critical current density of the first and the second bare superconducting filaments under the operating condition; and
    $C_{fil}$ is a heat capacity per unit volume of the first and the second bare superconducting filaments under the operating condition.

5. The superconducting joint according to claim 1, wherein: a critical current density of the first bare superconducting filaments under the operating condition is less than an average critical current density of the first superconducting filaments embedded in the first stabilizer matrix under the operating condition; and
    a critical current density of the second bare superconducting filaments under the operating condition is less than an average critical current density of the second superconducting filaments embedded in the second stabilizer matrix under the operating condition.

6. The superconducting joint according to claim 1, the first and the second bundles and the intermediate superconductor are contained in a joint cover for crimping together the first and the second bundles and the intermediate superconductor.

7. The superconducting joint according to claim 6, wherein: the joint cover is a metal pipe; and
    the first and the second bundles, the intermediate superconductor and the metal pipe are compressed together by an external compressing force so that the first and the second bundles and the intermediate superconductor are crimped together in the metal pipe.

8. The superconducting joint according to claim 7, wherein a thermal expansion coefficient of the metal pipe in a temperature range from room temperature to the operating temperature is greater than a thermal expansion coefficient of the first and the second bare superconducting filaments in the temperature range.

9. The superconducting joint according to claim 6, wherein: the joint cover is a pair of metal plates having metal bolts therethrough;
    the first and the second bundles and the intermediate superconductor are sandwiched between the metal plates; and
    the metal plates are tightened against each other by the metal bolts so that the first and the second bundles and the intermediate superconductor are crimped together between the metal plates.

10. The superconducting joint according to claim 9, wherein a thermal expansion coefficient of the metal bolts in a temperature range from room temperature to the operating temperature is greater than a thermal expansion coefficient of the first and the second bare superconducting filaments in the temperature range.

11. The superconducting joint according to claim 1, wherein the intermediate superconductor is made of niobium or an alloy primarily of niobium and titanium.

12. A nuclear magnetic resonance or magnetic resonance imaging apparatus, including the superconducting joint of claim 1.

13. A method for manufacturing a superconducting joint for electrically connecting a first multifilamentary superconducting wire including a plurality of first niobium-titanium filaments embedded in a first stabilizer matrix and a second multifilamentary superconducting wire including a plurality of second niobium-titanium filaments embedded in a second stabilizer matrix, the method comprising the steps of:

removing the first stabilizer matrix and exposing the first niobium-titanium filaments at a first end joint portion of the first superconducting wire;

removing the second stabilizer matrix and exposing the second niobium-titanium filaments at a second end joint portion of the second superconducting wire;

inserting, in a metal pipe, a first bundle of the exposed first niobium-titanium filaments, a second bundle of the exposed second niobium-titanium filaments, and a niobium-titanium intermediate plate in such a manner that the intermediate plate is interposed between the first and the second bundles, the intermediate plate having a critical current density under an operating condition of the superconducting joint less than the exposed first and the exposed second niobium-titanium filaments; and crimping the intermediate plate and the first and the second bundles together by compressing the metal pipe by a compressing force normal to broad surfaces of the intermediate plate.

14. The method according to claim 13, further comprising, prior to the filament exposing step, the step of adjusting the critical current densities of the first and the second niobium-titanium filaments in the first and the second end joint portions of the first and the second superconducting wires by heating the first and the second end joint portions at a temperature from 400 to 600° C.

* * * * *